United States Patent
Chen et al.

(10) Patent No.: US 8,231,014 B2
(45) Date of Patent: Jul. 31, 2012

(54) SUPPORT SLIDE ASSEMBLY FOR A CABLE MANAGEMENT ARM

(75) Inventors: Ken-Ching Chen, Kaohsiung Hsien (TW); Shun-Ho Yang, Kaohsiung Hsien (TW); Chun-Chiang Wang, Kaohsiung Hsien (TW)

(73) Assignee: King Slide Works Co., Ltd., Kaohsiung Hsien (TW)

( * ) Notice: Subject to any disclaimer, the term of this patent is extended or adjusted under 35 U.S.C. 154(b) by 300 days.

(21) Appl. No.: 12/757,317

(22) Filed: Apr. 9, 2010

(65) Prior Publication Data

US 2010/0193646 A1 Aug. 5, 2010

Related U.S. Application Data

(63) Continuation-in-part of application No. 12/230,646, filed on Sep. 3, 2008, and a continuation-in-part of application No. 12/324,968, filed on Nov. 28, 2008, now Pat. No. 7,712,615.

(51) Int. Cl.
*A47F 7/00* (2006.01)

(52) U.S. Cl. ........ 211/26; 211/175; 312/223.2; 361/826

(58) Field of Classification Search .............. 248/49, 248/282.1; 211/26, 175; 312/223.2, 220.1, 312/265.1, 265.4; 361/826, 727, 829, 756, 361/741, 802
See application file for complete search history.

(56) References Cited

U.S. PATENT DOCUMENTS

| | | | | |
|---|---|---|---|---|
| 3,710,199 A | * | 1/1973 | Cignoni, Jr. | 361/827 |
| 4,614,383 A | * | 9/1986 | Polley et al. | 312/273 |
| 6,600,665 B2 | * | 7/2003 | Lauchner | 361/826 |
| 7,472,795 B2 | | 1/2009 | Dubon et al. | |
| 7,554,819 B2 | * | 6/2009 | Chen et al. | 361/826 |
| 7,712,615 B2 | * | 5/2010 | Chen et al. | 211/26 |
| 7,746,667 B1 | * | 6/2010 | Baiza et al. | 361/825 |
| 2005/0145582 A1 | | 7/2005 | Dubon et al. | |
| 2006/0081735 A1 | | 4/2006 | Chen et al. | |
| 2006/0081736 A1 | | 4/2006 | Chen et al. | |
| 2006/0113433 A1 | | 6/2006 | Chen et al. | |
| 2009/0014601 A1 | | 1/2009 | Chen et al. | |
| 2009/0065658 A1 | | 3/2009 | Chen et al. | |
| 2009/0078834 A1 | | 3/2009 | Chen et al. | |

FOREIGN PATENT DOCUMENTS

DE 202004019451 U1 * 3/2005

* cited by examiner

*Primary Examiner* — Kimberly Wood
(74) *Attorney, Agent, or Firm* — Rosenberg, Klein & Lee

(57) ABSTRACT

A support slide assembly for a cable management arm includes first and second slide assemblies. The cable management arm is connected between the two slide rails of the first slide assembly. A third pivot member and a sliding member are located between first and second pivot members on two ends of the cable management arm. Two ends of a support slide rail are connected to the first and second slide assemblies respectively. The support rail is retractable by the slidable first and second rods. The first rod has one end pivotably connected to a sliding block which is slidably connected to the first slide assembly. The second rod has one end pivotably connected to the second slide assembly. The sliding member is slidably connected to the support slide rail. When the first slide assembly pulls the cable management arm out, the first and second rods extend relative to each other and form an angle relative to the first and second slide assemblies.

4 Claims, 5 Drawing Sheets

SUPPORT SLIDE ASSEMBLY FOR A CABLE MANAGEMENT ARM

The present invention is a Continuation-In-Part application of U.S. patent application Ser. No. 12/230,646, filed on Sep. 3, 2008, currently pending, and U.S. patent application Ser. No. 12/324,968, filed on Nov. 28, 2008, currently pending. The length of the support slide assembly is adjustable. The support slide assembly has one end pivotably connected to the slide rail and the other end is slidably connected to another slide rail by a sliding block, such that the length of the support slide assembly can be automatically adjusted.

FIELD OF THE INVENTION

Background of the Invention

A conventional electronic product, such as a server, mounted on a slide-in chassis, is provided with two slides on both sides thereof so that the electronic product slides to travel on both slides. A cable management arm to contain and restrict the cable.

As disclosed in U.S. Pat. Nos. 4,353,518, 4,614,383, 5,571,256, 6,303,864B1, 6,305,556B1, 6,442,030B1, 6,600,665B1, and US Patent Application No. 2003/0026084A1, 2003/0222034A1, and 2004/0079711A1, the cable management arm is usually cooperated with two slides and includes two ends as supports. A retractable member, generally in the form of a hinge, is provided between the two ends of the cable management arm. The retractable member is suspended at a position away from either end when it is retracted.

Due to the weight, the cable management arm and the cables tend to droop over a certain period of time to negatively affect the operation in a highly intensively slide-in space due to the mass of the cable and the cable management arm.

SUMMARY OF THE INVENTION

The present invention relates to a support slide assembly which comprises a first slide assembly and a second slide assembly, and each of the first and second slide assemblies has a first slide rail, a second slide rail slidably connected to the first slide rail, and a third slide rail slidably connected to the second slide rail. A cable management arm has a first pivot member and a second pivot member, and a third pivot member is located between the first pivot member and the second pivot member. The first pivot member is connected to the first slide rail of the first slide assembly, and the second pivot member is connected to the third slide rail of the first slide assembly. A support slide rail has a first rod and a second rod which is slidably connected to the first rod. The first rod is pivotably connected to a sliding block which is slidably connected to the first slide rail of the first slide assembly. The second rod has one end pivotably connected to a fixing member which is fixed to the first slide rail of the second slide assembly. A sliding member is located between the first pivot member and the second pivot member of the cable management arm. The sliding member is slidably connected to the first rod. The third slide rail of the first slide assembly pulls out the cable management arm and the sliding member is moved along the first rod by the movement of the cable management arm. The cable management arm drives the first rod by moving the sliding block relative to the first slide rail of the first slide assembly. The first and second rods extend an angle relative to the first and second slide assemblies.

The first rod includes a slide slot in which the sliding member is slidably engaged.

The sliding member is pivotably connected to the cable management arm and includes a space for accommodating the first rod slidably engaged therewith.

The sliding member is located between the first end of the cable management arm and the pivot member.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
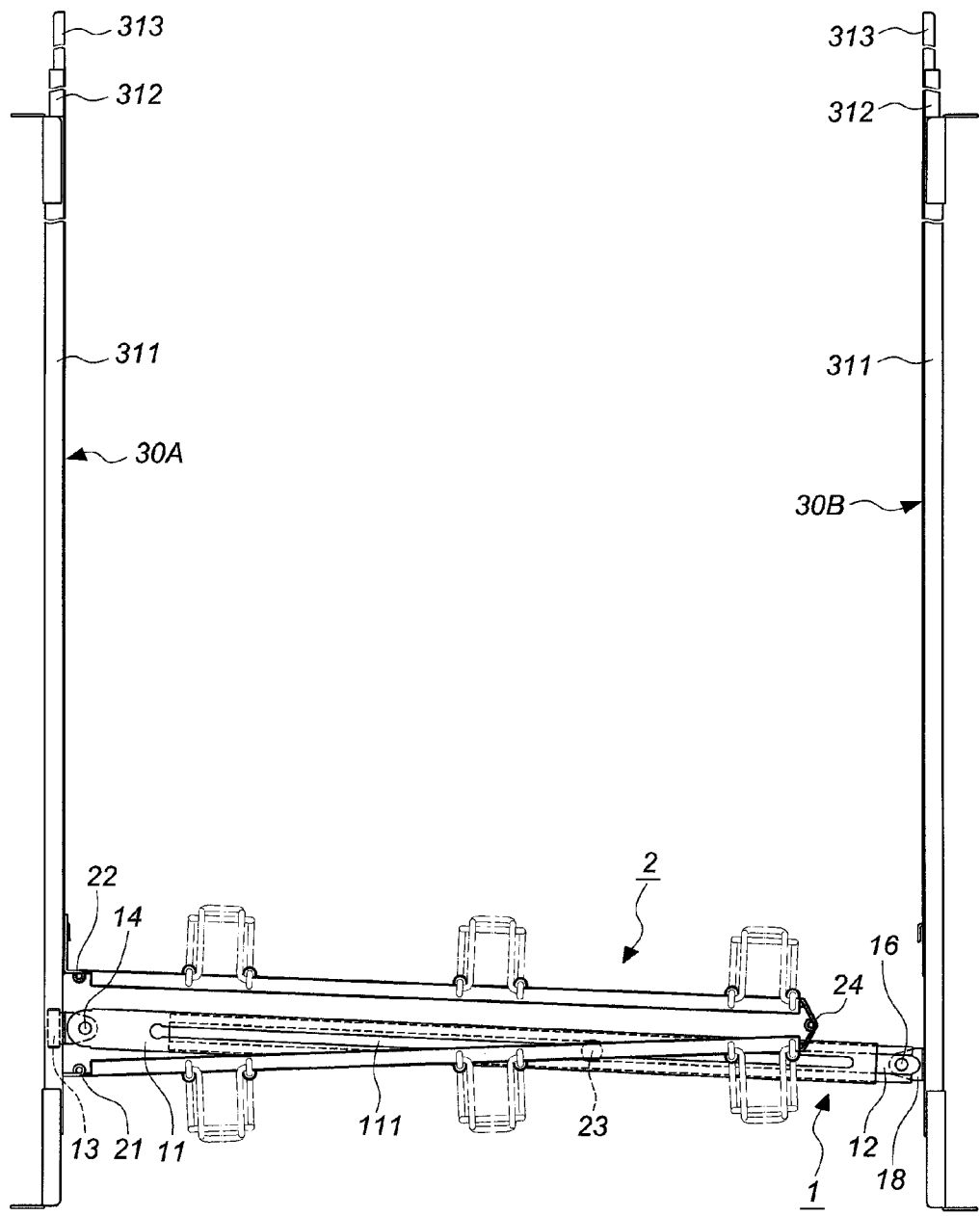
FIG. 1 shows the cable management arm of the present invention connected between the two slide assemblies.

Referring to FIG. 1, the present invention comprises a support slide rail 1, a cable management arm 2 including a first pivot member 21 and a second pivot member 22, and a first slide assembly 30A and a second slide assembly 30B. Each of the first and second slide assemblies 30A, 30B includes a first slide rail 311, a second slide rail 312 slidably connected to the first slide rail 311, and a third slide rail 313 slidably connected to the second slide rail 312. The cable management arm 2 has the first pivot member 21 thereof connected to the first slide rail 311 of the first slide assembly 30A and the second pivot member 22 of the cable management arm 2 is connected to the third slide rail 313 of the first slide assembly 30A.

A third pivot member 24 is located between the first pivot member 21 and the second pivot member 22 of the cable management arm 2, so that the first pivot member 21 and the second pivot member 22 can be moved away from each other or toward each other.

A sliding member 23 is located between the first pivot member 21 and the second pivot member 22 of the cable management arm 2, and the sliding member 23 is slidably connected to the support slide rail 1. The sliding member 23 is located between the first pivot member 21 of the cable management arm 2 and the third pivot member 24.

Figure 2:
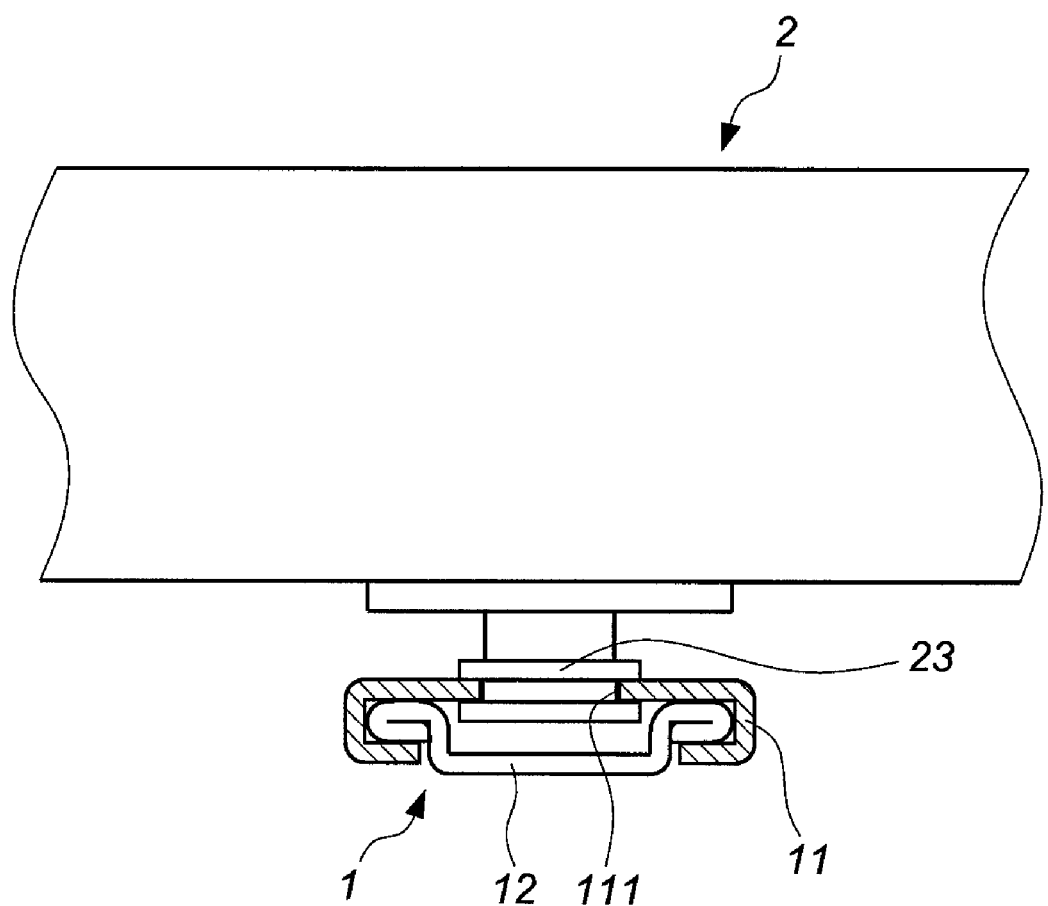
FIG. 2 shows an end cross sectional view of the connection of the support slide rail and the sliding member.

The support slide rail 1 includes a first rod 11 and a second rod 12 which is slidably connected to the first rod 11. The first rod 11 is pivotably connected to a sliding block 13 by a pivoting pin 14. Preferably, the first rod 11 has one end connected to the sliding block 13 by the pivoting pin 14 and the sliding block 13 is slidably connected to the first slide rail 311 of the first slide assembly 30A. The second rod 12 has one end pivotably connected to the fixing member 18 by a second pin 16. The fixing member 18 is fixed to the first slide rail 311 of the second slide assembly 30B so as to allow the second rod 12 to swing. The first and second rods 11, 12 are moveable relative to each other so as to change its length. The first rod 11 includes the slide slot 111 to slidably accommodate the sliding member 23 as shown in FIG. 2.

Figure 3:
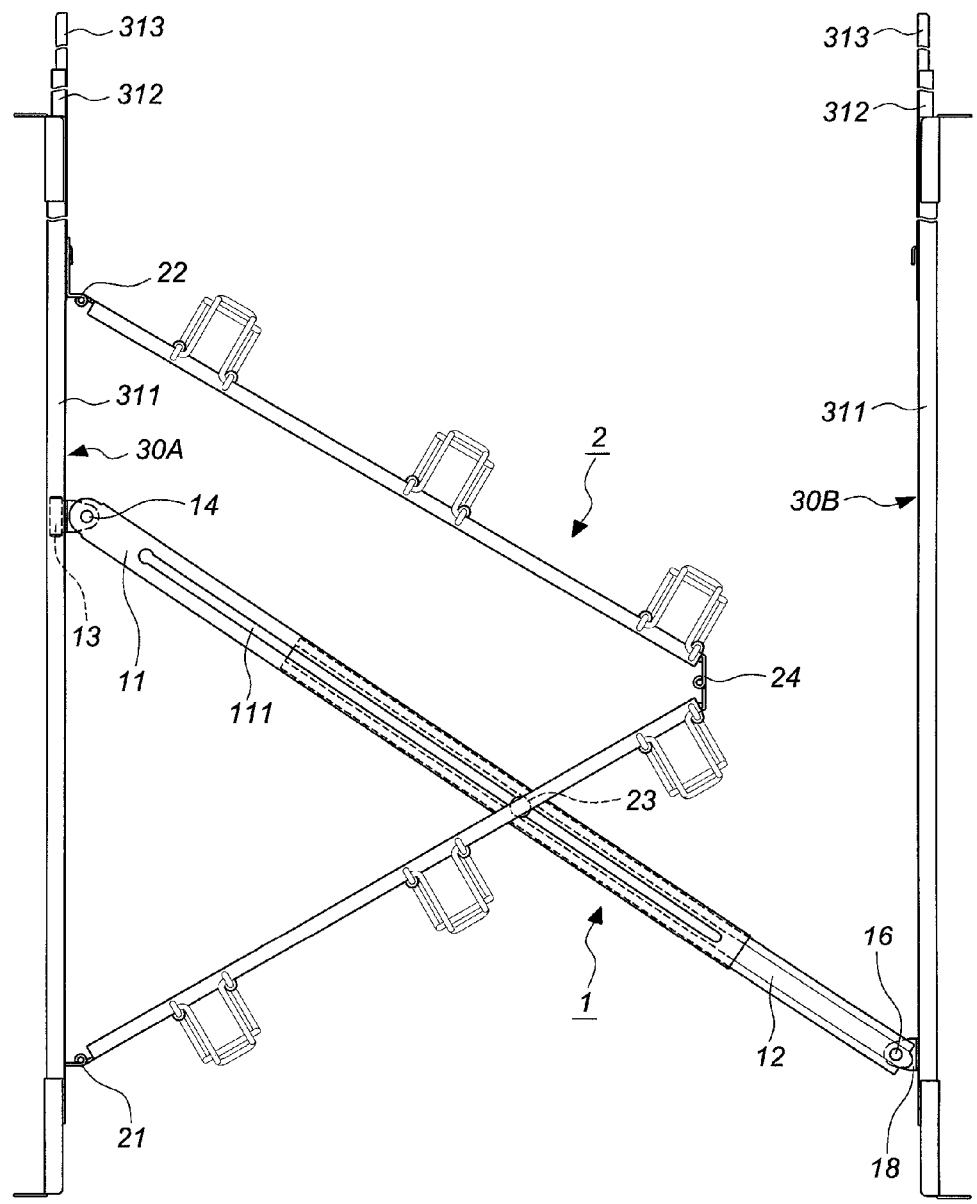
FIG. 3 shows that the cable management arm is pulled by the slide assembly.
Figure 4:
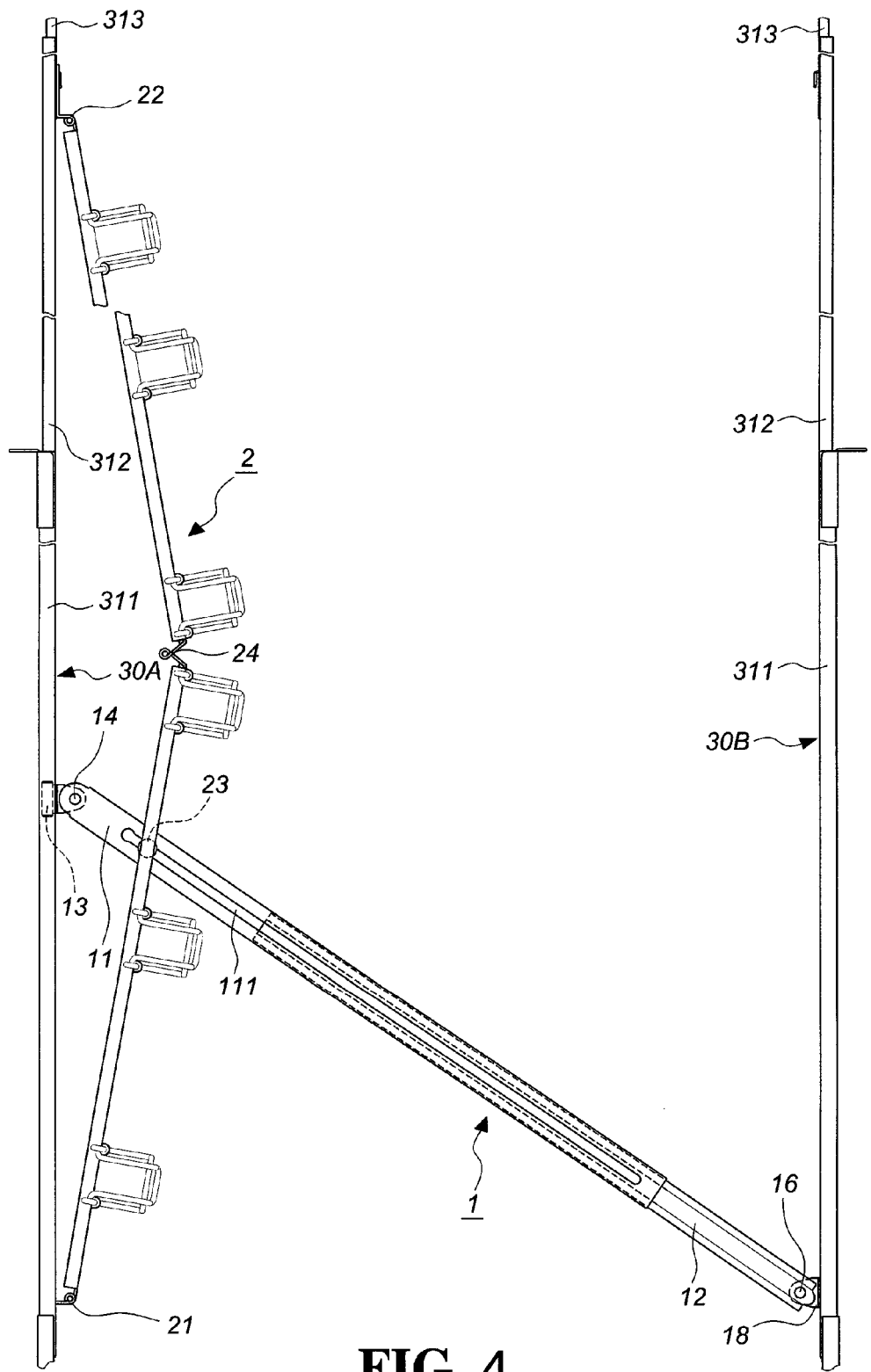
FIG. 4 shows that the cable management arm is further pulled by the slide assembly.

When the third slide rail 313 of the first slide assembly 30A pulls out the cable management arm 2 as shown in FIGS. 3 and 4, the sliding member 23 is moved along the first rod 11 by the movement of the cable management arm 2. The cable management arm 2 drives the first rod 11 by moving the sliding block 13 relative to the first slide rail 311 of the first slide assembly 30A. The first and second rods 11, 12 then extend an angle relative to the first and second slide assemblies 30A, 30B. In other words, when the cable management arm 2 is pulled or retracted, the sliding member 23 is moved by the cable management arm 2 and moves along the slide slot 111. The first rod 11 and the second rod 12 of the support slide rail 1 slides and swings by the movement of the cable management arm 2. Especially, the sliding member 23 is able to drive the first and second rods 11, 12 to extend or retracted to form a tilt angle relative to the first and second slide assemblies 30A, 30B.

Figure 5:
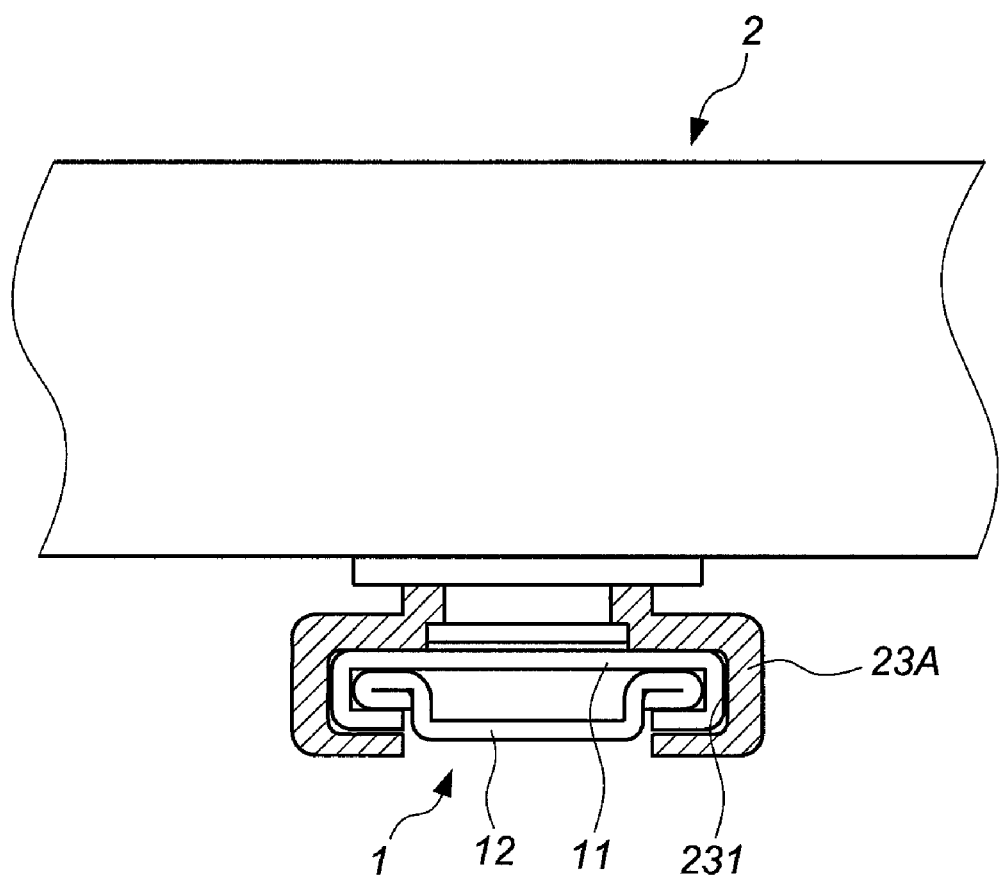
FIG. 5 shows a cross sectional view of another embodiment of the connection of the support slide rail and the sliding member.

FIG. 5 shows another embodiment, wherein the sliding member 23A is pivotably connected to the cable management arm 2 and includes a space 231 for accommodating the first rod 11 slidably engaged therewith.

The first and second rods 11, 12 of the present invention are able to move relative to each other to allow the support slide rail 1 to tilt relative to the first and second slide assemblies 30A, 30B. When the cable management arm 2 is expanded or retracted, the sliding member 23 or 23A drives the support slide rail 1 when the first rod 11 moves, and the sliding block 13 moves relative to the first and second slide assemblies 30A, 30B. When the cable management arm 2 is expanded or retracted, the weight of the cable and the cable management arm 2 is partially supported by the support slide rail 1 to prevent the cable management arm 2 from overly suspended downward.

While we have shown and described the embodiment in accordance with the present invention, it should be clear to those skilled in the art that further embodiments may be made without departing from the scope of the present invention.

What is claimed is:

1. A support slide assembly comprising:
a first slide assembly and a second slide assembly, each of the first and second slide assemblies having a first slide rail, a second slide rail slidably connected to the first slide rail, a third slide rail slidably connected to the second slide rail;
a cable management arm having a first pivot member and a second pivot member, a third pivot member located between the first pivot member and the second pivot member, the first pivot member connected to the first slide rail of the first slide assembly, the second pivot member connected to the third slide rail of the first slide assembly, a support slide rail having a first rod and a second rod which is slidably connected to the first rod, characterized in that the first rod is pivotably connected to a sliding block which is slidably connected to the first slide rail of the first slide assembly, the second rod has one end pivotably connected to a fixing member which is fixed to the first slide rail of the second slide assembly, and
a sliding member is located between the first pivot member and the second pivot member of the cable management arm, the sliding member is slidably connected to the first rod, the third slide rail of the first slide assembly pulls out the cable management arm and the sliding member is moved along the first rod by movement of the cable management arm, the cable management arm drives the first rod by moving the sliding block relative to the first slide rail of the first slide assembly, the first and second rods extend relative to each other and form an angle relative to the first and second slide assemblies.

2. The support slide assembly as claimed in claim 1, wherein the first rod includes a slide slot in which the sliding member is slidably engaged.

3. The support slide assembly as claimed in claim 1, wherein the sliding member is pivotably connected to the cable management arm and includes a space for accommodating the first rod slidably engaged therewith.

4. The support slide assembly as claimed in claim 1, wherein the sliding member is located between the first pivot member of the cable management arm and the third pivot member.

* * * * *